United States Patent
Ueki et al.

(10) Patent No.: US 6,626,526 B2
(45) Date of Patent: Sep. 30, 2003

(54) LAYERED UNIT PROVIDED WITH PIEZOELECTRIC CERAMICS, METHOD FOR PRODUCING THE SAME, AND INK JET PRINTING HEAD EMPLOYING THE SAME

(75) Inventors: Chitoshi Ueki, Kokubu (JP); Yasuharu Tateyama, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/917,610

(22) Filed: Jul. 27, 2001

(65) Prior Publication Data

US 2002/0036679 A1 Mar. 28, 2002

(30) Foreign Application Priority Data

Jul. 27, 2000 (JP) ........................... 2000-227824
Dec. 19, 2000 (JP) ........................... 2000-385445

(51) Int. Cl.$^7$ ............................................ B41J 2/045
(52) U.S. Cl. ........................................................ 347/72
(58) Field of Search .............................. 347/54, 68, 69, 347/70, 71, 72

(56) References Cited

U.S. PATENT DOCUMENTS

| 5,631,680 A | * | 5/1997 | Sugahara | 347/69 |
| 5,755,909 A | | 5/1998 | Gailus | 156/229 |
| 5,779,837 A | | 7/1998 | Harvey | 156/153 |
| 6,245,187 B1 | | 6/2001 | Honsberg-Riedl et al. | 156/305 |

FOREIGN PATENT DOCUMENTS

| EP | 0-811667 | 12/1997 |
| EP | 0-956955 | 11/1999 |
| GB | 2-235577 | 3/1991 |
| JP | 9-254385 | 9/1997 |
| WO | 01/12442 | 2/2001 |

* cited by examiner

Primary Examiner—Anh T. N. Vo
(74) Attorney, Agent, or Firm—Hogan & Hartson, LLP

(57) ABSTRACT

A layered unit provided with piezoelectric ceramics having an increased adhesive strength while lowering cell content in an adhesive layer, a method for producing the layered unit, and an ink jet printing head incorporated with such layered unit having improved ink emission precision and durability as well as suppressing occurrence of assembly failure at the time of producing the ink jet printing head. The layered unit has a first member made of piezoelectric ceramics, a second member which is placed over the first member, and an adhesive layer which is formed between the first member and the second member to adhere the first member and the second member. A joint surface of the first member to be jointed to the second member is formed with a multitude of recesses. A sum of opening areas of the recesses occupies 50% or more relative to a total surface area of the joint surface of the first member. Alternatively, a crystalline part comprising the joint surface of the first member is formed with a multitude of microprotrusions.

25 Claims, 8 Drawing Sheets

LAYERED UNIT PROVIDED WITH PIEZOELECTRIC CERAMICS, METHOD FOR PRODUCING THE SAME, AND INK JET PRINTING HEAD EMPLOYING THE SAME

BACKGROUND OF THE INVENTION

1. Field of the Invention

This invention relates to a layered unit provided with piezoelectric ceramics for use in actuators, diaphragms, buzzers, etc., and more particularly to a layered unit provided with piezoelectric ceramics constructed in such a manner that a piezoelectric ceramics member, and a support member which is made of ceramics such as alumina, zirconia, and forsterite, or a metallic material, or a plastic material are adhered one over the other by an adhesive agent, a method of producing the layered unit, and an ink jet printing head using such layered unit.

2. Description of the Related Art

Heretofore, there has been used a layered unit provided with piezoelectric ceramics in actuators, diaphragms, buzzers, etc. The layered unit has a structure that a plate made of piezoelectric ceramics and a support plate adapted for fixedly supporting the piezoelectric ceramics plate are adhered one over the other via an adhesive layer made of a thermosetting adhesive agent. Also, a technology has been developed recently in which such layered unit is used as part for actuators in printing heads of ink jet image forming apparatus. The actuator is operated in such a manner that pressurized ink is emitted due to deformation of the piezoelectric ceramics plate (namely, layered unit).

Such layered unit is fabricated as follows. Paste-like thermosetting adhesive agent is applied onto a surface of a support plate or a surface of a piezoelectric ceramics plate which are adhered to each other, according to squeegee method, screen printing method, offset printing method, dispenser or the like. The piezoelectric ceramics plate and the support plate are adhered one over the other in a state that an adhesive layer made of the adhesive agent applied therebetween is subjected to thermosetting while being heated and pressurized.

When adhering the piezoelectric ceramics plate and the support plate, the surface of each of these plates which are adhered to each other is lapped to make the surface smooth. After making the surfaces smooth and flat, the thermosetting adhesive agent is applied onto the surface of the support plate or the surface of the piezoelectric ceramics plate so that the paste-like adhesive agent is securely spread over the entirety of the surfaces (adhered surfaces) by pressurization.

Generally, however, it is highly likely that the paste-like thermosetting adhesive agent is hard to spread over the surface of a piezoelectric ceramics plate even if being pressurized. Also, as the adhesive agent is being spread over the entirety of the adhered surfaces of the plates, air is likely to be intruded in the adhesive agent. It is highly likely that cell is formed in the adhesive layer of the layered unit after thermosetting, with the result that an area (non-adhesive area) where the adhesive agent has not bee applied may be formed on the joint surfaces of these plates due to the existence of such cells. Consequently, adhesive strength between the piezoelectric ceramics plate and the support plate may be lessened.

In use thereof, the piezoelectric ceramics plate of the layered unit is deformed each time a voltage is applied. Accordingly, the layered unit is required to have such an adhesive strength at the adhered surface thereof as to be durable against repeated deformations of the piezoelectric ceramics plate. In the case where a desired adhesive strength is not obtained due to intrusion of air in the adhesive agent (namely, formation of cells in the adhesive layer) or formation of a non-adhesive area, it is highly likely that reliability and durability of applied products such as actuators and diaphragms may be deteriorated.

When assembling a printing head of an ink jet image forming apparatus using the layered unit, a series of cutaways which function as ink flow channels are formed in the layered unit by machining with a diamond blade. In the case where the adhesive strength of the layered unit is insufficient, the layered unit may be broken at the poorly adhered part or the layer(s) constituting the layered unit may be peeled off during formation of these cutaways, which leads to increase of occurrence of assembly failure in a process of producing printing heads.

SUMMARY OF THE INVENTION

In view of the above, an object of this invention is to provide a layered unit having an increased adhesive strength due to lowering of cell content in an adhesive layer combined with improved spreadability of adhesive agent by an improvement on a surface of a piezoelectric ceramics member of the layered unit, a method for producing the layered unit, and an ink jet printing head incorporated with such layered unit having improved ink emission precision and durability as well as suppressing occurrence of assembly failure at the time of producing the printing head.

According to an aspect of this invention, a layered unit comprises a first member made of piezoelectric ceramics; a second member which is placed over the first member; and an adhesive layer which is formed between the first member and the second member to adhere the first member and the second member. A joint surface of the first member to be jointed to the second member is formed with a multitude of recesses. A sum of opening areas of the recesses occupying 50% or more relative to a total surface area of the joint surface of the first member. Alternatively, a crystalline part composing the joint surface of the first member is formed with a multitude of microprotrusions.

According to another aspect of this invention, a method of producing a layered unit having an improved adhesive strength comprises using piezoelectric ceramics containing lead zirconate titanate in which a total content of alumina ($Al_2O_3$) and silicon oxide ($SiO_2$) relative to the piezoelectric ceramics is 0.08 mass % or less, as a material for a first member. The method has a step of forming a multitude of recesses in a joint surface of a first member to be jointed to a second member by lapping the joint surface by grains of silicon carbide having a grain diameter in the range from 5 to 10 $\mu$m as free abrasive grains, or by grinding with a diamond wheel leaving diamond grains of a grain diameter in the range from 5 to 10 $\mu$m. As an altered arrangement, the method has a stop of forming a multitude of microprotrusions on a crystalline part of the joint surface of the first member by plasma treatment. Subsequently, an adhesive agent is applied onto at least one of the joint surface of the first member and a surface of the second member to adhere the first member and the second member to form a joint unit. Then, the adhesive agent is cured while pressurizing the joint unit.

According to still another aspect of this invention, an ink jet printing head comprises a base plate; an array of ink flow channels each defined by a pair of partition walls composed of a piezoelectric member, the ink flow channels being arrayed on the base plate in a widthwise direction of the ink jet printing head at a certain interval; and pairs of electrodes each provided at opposing sides of each partition wall to apply a voltage to deform the partition walls.

It may be preferable to form a multitude of recesses in the joint surface of the partition wall to be jointed to the base plate in such a manner that a surface area ratio of the recesses relative to a total surface area of the joint surface is set at 50% or more and to adhere the partition wall and the base plate by the adhesive agent. Alternatively, it may be preferable to form a multitude of microprotrusions on the joint surface of the partition wall to be jointed to the base plate and adhere the partition wall and the base plate by the adhesive agent.

These and other objects, features and advantages of the present invention will become more apparent upon a reading of the following detailed description and accompanying drawing.

DETAILED DESCRIPTION OF THE PREFERRED EMBODIMENTS OF THE INVENTION

[Piezoelectric Ceramics Layered Unit]

First, a layered unit provided with piezoelectric ceramics as a first embodiment of this invention is described with reference to FIG. 1.

Figure 1:
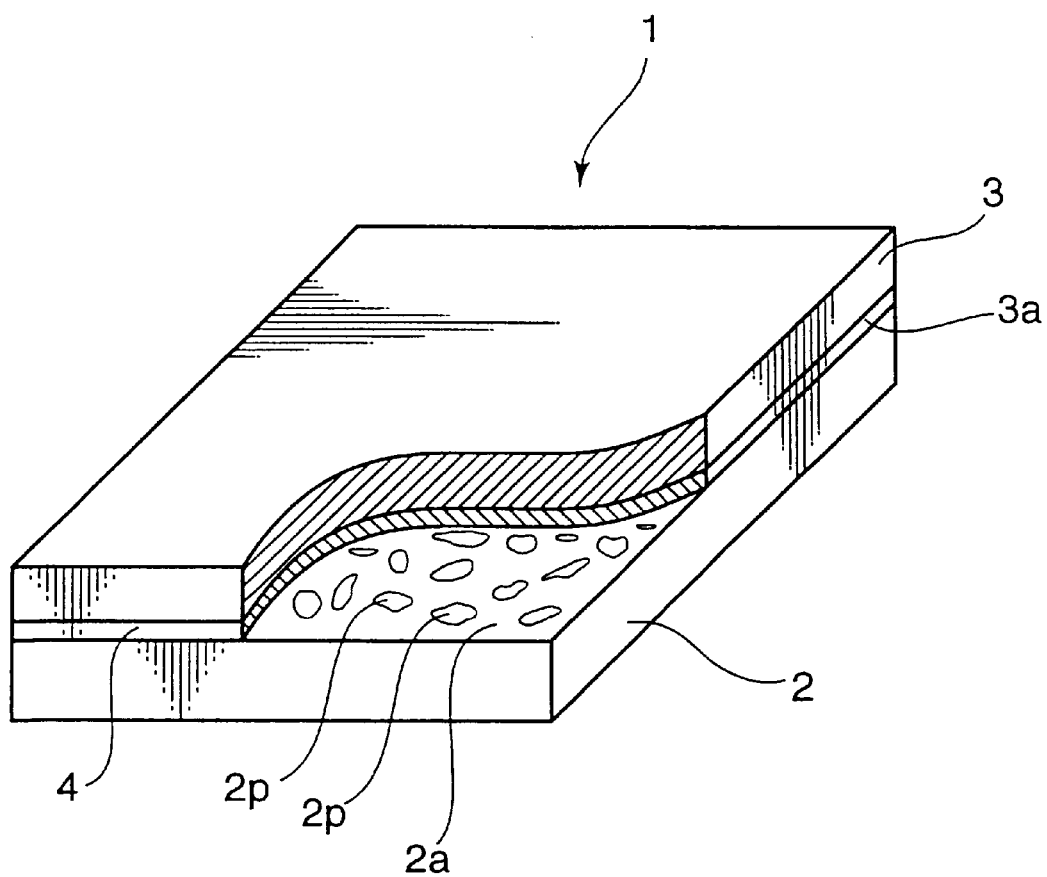
FIG. 1 is a schematic diagram showing an arrangement of a layered unit provided with piezoelectric ceramics according to a first embodiment of this invention.

A layered unit 1 shown in FIG. 1 comprises a first member 2 made of piezoelectric ceramics, a second member 3, and an adhesive layer 4. The layered unit 1 has a construction in such a manner that the second member a is placed on a top surface 2a of the first member 2 via the adhesive layer 4.

A multitude of recesses 2p are formed in the top surface 2a of the first member 2. The recesses 2p occupy 50% or more relative to the surface area of the top surface 2a (hereinafter, referred to as "surface area ratio"). Preferably, the surface area ratio of the recesses 2p may be 80% or more. Namely, the more the surface area ratio is, the greater the effects of this invention are obtained.

The surface area ratio of the recesses relative to the top surface 2a of the piezoelectric ceramics member 2 according to this invention is an area ratio obtained by dividing a sum of surface areas of the recesses 2p which are viewable and measurable from right above the top surface 2a, by an entire surface area of the top surface 2a. In this invention, the area ratio is calculated by dividing a total surface area of the recesses 2p within a field of view (magnification: 200, field of view: 2.8 mm×2.8 mm) which has been measured by image processing by an image analyzer (Model LUZEX-FX, product of Nireko), by the surface area of the top surface 2a corresponding to the field of view which has been measured by the image analyzer.

Figure 3:
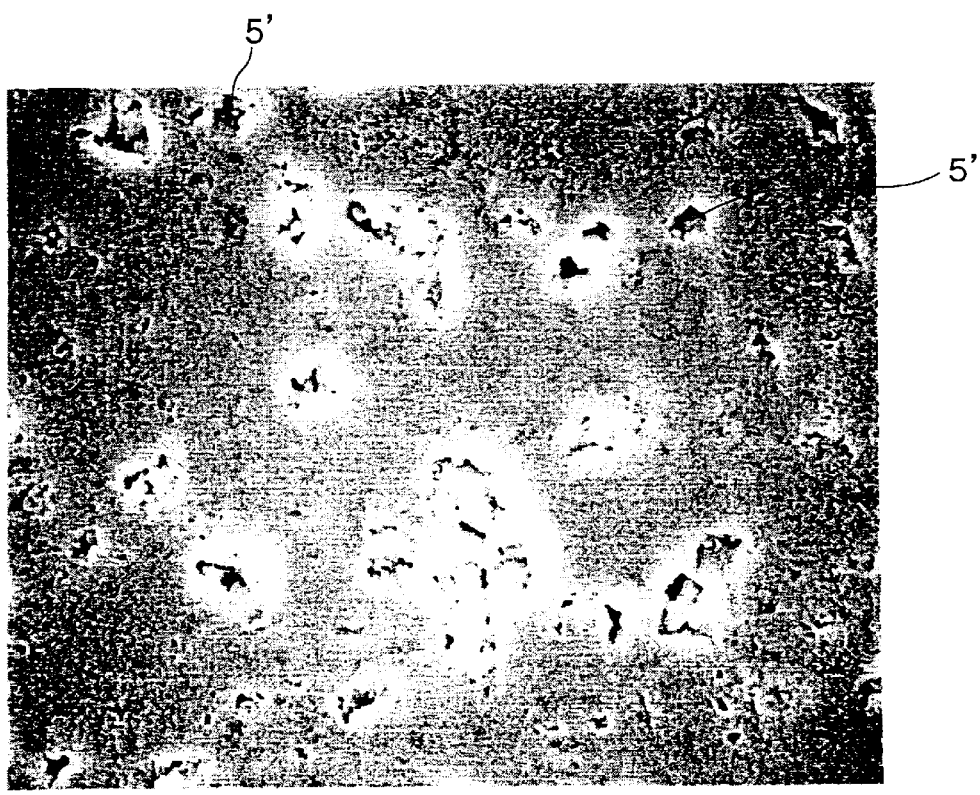
FIG. 3 is an SEM photograph taken by the scanning electron microscope (SEM) showing a state of a top surface of a member corresponding to the first member in a conventional layered unit.

The recesses 2p are voids which have been formed in the top surface 2a at the time of sintering piezoelectric ceramics, or pores which have been formed by shedding of crystalline grains when grinding the top surface 2a to make the top surface 2a smooth and flat. Generally, piezoelectric ceramics are liable to form recesses owing to formation of voids in the surface by sintering or owing to shedding by grinding the surface to make the surface flat and smooth. However, as shown in FIG. 3, the surface of the conventional piezoelectric ceramics plate has an extremely small surface area ratio of recesses 5'. Therefore, increase of adhesive strength of the adhesive layer cannot be expected in the conventional layered unit.

Piezoelectric ceramics used as a material for the first member 2 include lead zirconate titanates (PZTs), lead magnesium niobates (PMNs), lead nickel niobates (PNNs), and piezoelectric ceramics containing one or more of these salts as a main ingredient. Main ingredients of these salts contain $Al_2O_3$ and $SiO_2$ as impurities. Preferably, the total content of these impurities is 0.08 mass % or less, and more preferably, 0.05 mass %.

$Al_2O_3$ and $SiO_2$ have a physical property such that a liquid phase is liable to he formed in a grain boundary when the ceramics is being sintered, with a result that a glass phase primarily containing $PbO$—$Al_2O_3$—$SiO_2$ may be formed in the grain boundary after the sintering. The thus formed glass phase has a higher toughness against breakage than a crystalline part of piezoelectric ceramics. Accordingly, it is highly likely that breakage or breaks within the grains may occur. Suppressing formation of the glass phase causes breaks in the grain boundary more easily than breaks inside the grains, thus enabling to promote shedding of crystal grains and resultantly raise the surface area ratio of the recesses 2p.

It is preferable to set the grain diameter of crystal of the piezoelectric ceramics composing the first member 2 smaller, specifically, at 5 µm or less. This is because in the case where the crystal grain diameter is larger, a crack which is generated accompanied by pressurization in the process of forming the recesses 2p is liable to spread as breaking through the grains of crystal, which resultantly promotes breaks in the crystal grains. Thus, breakage in the grains occurs much more frequently.

On the contrary, in the case where the crystal grain diameter is smaller, it is highly likely that a crack is generated along the grain boundary of crystal. As a result, breakage in the grain boundary occurs much more frequently, which facilitates shedding of crystal grains.

The size of each recess 2p differs depending on whether the recess 2p is a void or a pore generated by shedding.

Generally, the size of the recess 2p is in the range from 5 to 30 μm, and the shape thereof is not limited.

It is preferable to machine the top surface 2a of the first member 2 which is to be adhered to the second member 3 by way of the adhesive layer 4 in the following manner to set the surface area ratio of the recesses 2p relative to the surface area of the top surface 2a at 50% or more. A first preferable machining method is lapping with a double-sided lapping machine employing silicon carbide grains of grain diameter from 5 to 10 μm as free abrasive grains. A second preferable machining method is grinding with a surface grinding machine using a diamond wheel with diamond abrasive grains of a diameter from 5 to 10 μm attached thereto. In the case where piezoelectric ceramics which likely causes breakage in the grain boundary is used, the surface 2a having a surface area ratio of 50% or more is easily obtained by combination of these two machining methods, Metal, resin, ceramics, or its equivalent can be used as a material for the second member 3. One or more of these materials is or are selected according to needs. Metal includes tin, aluminum, copper, nickel, titan, iron, molybdenum, an alloy containing one or more of these metal elements, and stainless steel. Ceramics include: a variety of insulating ceramics each of which contain alumina, zirconia, forsterite, and silicon nitride as a main ingredient; and a variety of piezoelectric ceramics each of which contains lead zirconate titanates (PZTs), as a magnesium niobates (PMNs), lead nickel niobates (PNNs) as a main ingredient. In the case where a great adhesive strength is required, it is preferable to use a material having a coefficient of thermal expansion similar to that of the piezoelectric ceramics composing the first member 2.

The thermosetting adhesive agent used for the adhesive layer 4 includes epoxy resin adhesive agent, polyimide resin adhesive agent, and phenol resin adhesive agent. Among these, it is preferable to use epoxy resin adhesive agent exhibiting great adhesive strength.

The layered unit 1 is fabricated by applying the adhesive agent onto the top surface 2a of the first member 2 or a button surface 3a of the second member 3, attaching the top surface 2a of the first member 2 and the bottom surface 3a of the second member 2 to each other, and pressurizing and heating these members 2 and 3 to allow the adhesive layer to cure. During the curing, the adhesive agent, even if having a high viscosity, sufficiently spreads in each of the recesses 2p in the top surface 2a, with the result that the adhesive agent sufficiently spreads over the entirety of the top surface 2a including cavities of all the recesses 2p. Thus, there can be suppressed air intrusion into the adhesive agent during application of the adhesive agent. Consequently, there can be prevented formation of cells in the adhesive layer 4 after thermosetting which are traces of air intrusion, and accordingly, the adhesive strength of the adhesive layer is remarkably increased. It is preferable to heat and cure the adhesive agent under a depressurized condition to further suppress cell content in the adhesive layer 4.

Next, a piezoelectric ceramics layered member as a second embodiment of this invention is described with reference to FIG. 4.

Figure 4:
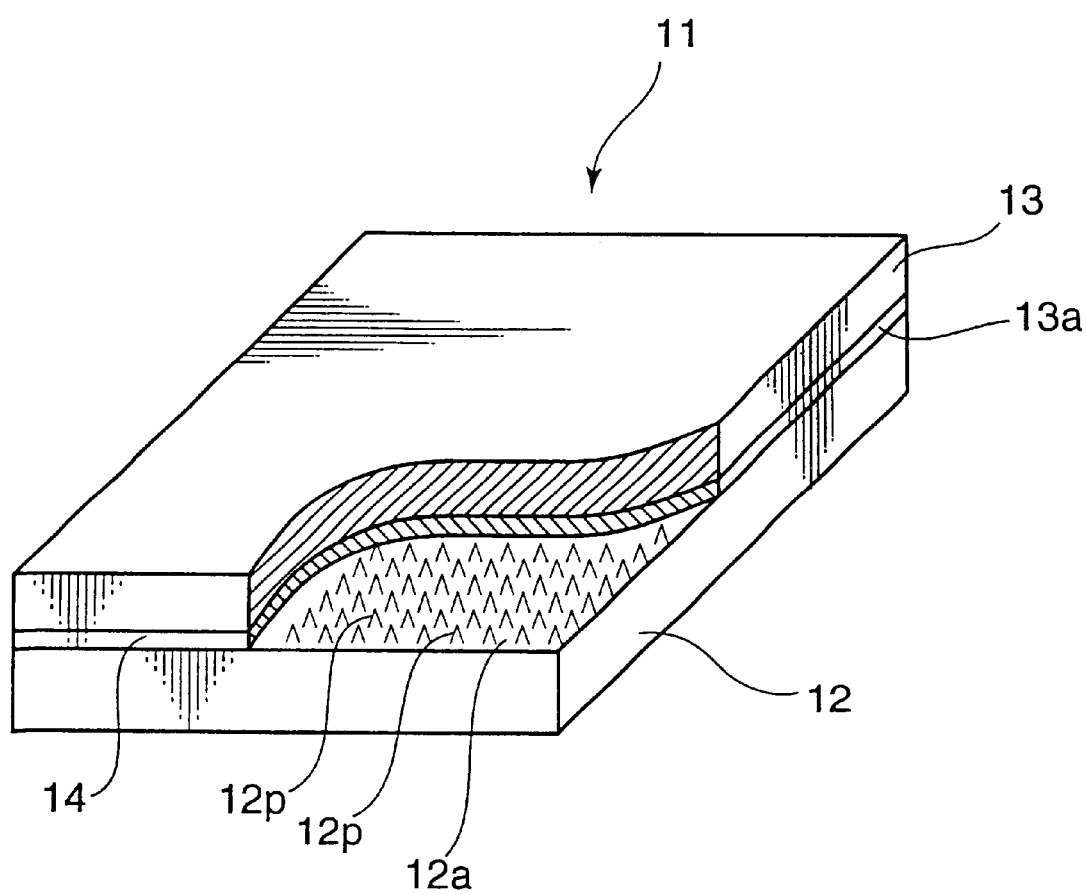
FIG. 4 is a schematic diagram showing an arrangement of a layered unit of a second embodiment of this invention.

A layered unit 11 shown in FIG. 4 comprises a first member 12 made of piezoelectric ceramic, a second member 13, and an adhesive layer 14. The layered unit 11 is constructed in such a manner that the second member 13 is placed over a top surface 12a of the first member 12 via the adhesive layer 14.

A multitude of microprotrusions (ciliary protrusions) 12p are formed on a crystalline part of the top surface 12a of the first member 12. Each microprotrusions 12p has the same composition as the crystal part, and is formed by making the surface of the crystalline part rough.

It is preferable to set the surface area ratio of microprotrusions 12p relative to the entire surface area of the top surface 12a of the first member 12 in the range of 5 to 40%, and more preferably from 5 to 20%. The surface area ratio is determined based on how many percentage in terms of surface area the total number of the microprotrusions 12p occupies within the crystalline part of $10^{-6}$ to $10^{-8}$ mm$^2$ an a measured area when partially and enlargedly observing the top surface 12a from above by a microscope. When the surface area ratio is less than 5%, the ratio of microprotrusions 12p on the crystalline part is insufficient. A top surface having such a small ratio cannot provide an effect of raising surface energy of the top surface, which obstructs an idea of increasing spreadability of thermosetting adhesive agent.

On the contrary, when the surface areas ratio exceeds 40%, it is highly likely that air is trapped in the vicinity of microprotrusions, thereby raising possibility of air intrusion, although sufficient wettability of adhesive agent can be secured.

The size of each microprotrusion 12p is preferably in the range from 0.01 to 0.1 μm, and more preferably in the range from 0.01 to 0.07 μm. It is preferable that the microprotrusions 12p are distributed uniformly over the entirety of the top surface 12a.

Figure 5:
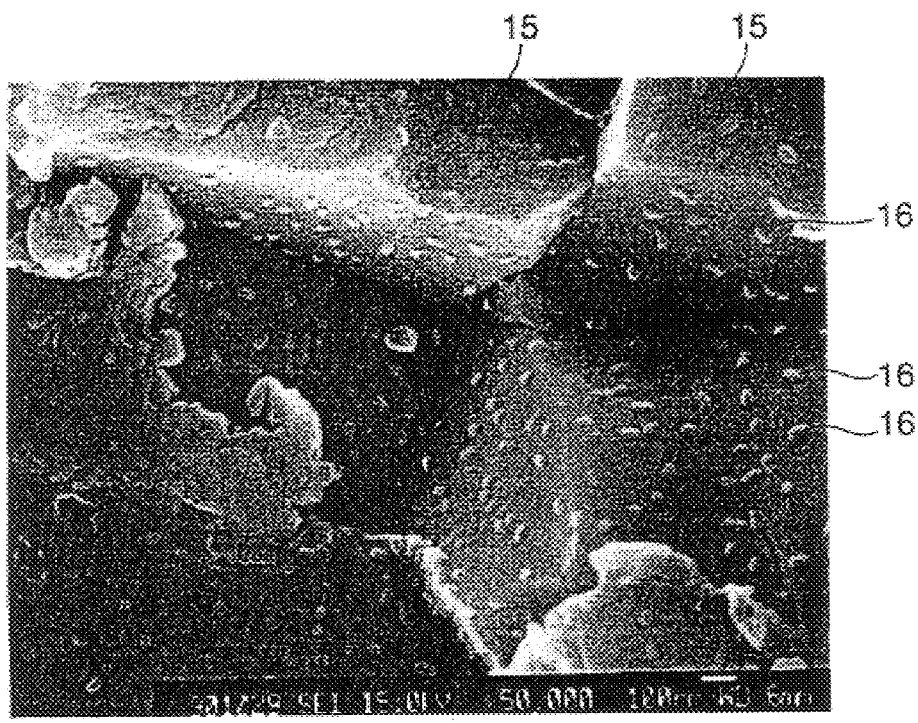
FIG. 5 is an (SEM) photograph taken by the scanning electron microscope (SEM) showing a state of a top surface of a first member composed of piezoelectric ceramics of the layered unit of the second embodiment.
Figure 6:
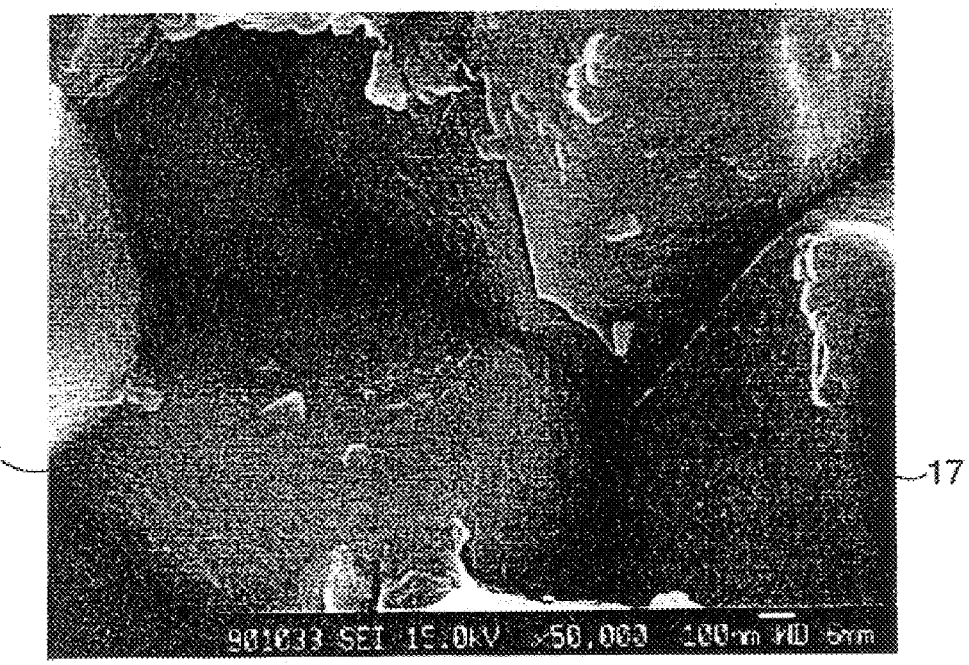
FIG. 6 is an SEM photograph taken by the scanning electron microscope (SEM) showing a state of a top surface of a member corresponding to the first member in a conventional layered unit.

The surface area ratio of microprotrusions 12p is calculated by analyzing a photograph (SEM photograph) which has been taken by a scanning electron microscope with a magnification of 50,000 to 100,000 by an image analyzer (Model LUZEX-FS, product by Nireko) to obtain surface areas of crystalline part and microprotrusions 12p within a measured area. The crystalline part and the microprotrusions are identifiable based on color gradations. In the SEM photograph (magnification: 50,000) showing the top surface 12a in FIG. 5, reference numeral 15 denotes a crystalline part, and 16 denotes a microprotrusion on the surface of the crystalline part. FIG. 6 is a SEM photograph (magnification: 50,000) showing a surface of a conventional piezoelectric ceramics plate. As shown in the photograph of FIG. 6, a crystalline part 17 is made flat without microprotrusions.

In the layered unit 11, it is preferable to form recesses in the top surface 12a other than the part where microprotrusions 12p are not formed (altered arrangement). Synergic effect of microprotrusions and recesses in the top surface 12a further increases spreadability of thermosetting adhesive agent applied on the top surface 12a, thereby while suppressing cell content in the adhesive layer 14. Thereby, adhesive strength of the layered unit 11 as a whole is increased. It is preferable to set the surface area ratio of recesses formed in the top surface 12a relative to the measured area at 50% or more when partially and enlargedly measured by a microscope.

The surface area ratio of recesses relative to the measured area in this altered arrangement is an area ratio calculated by dividing a sum of surface areas of the recesses including voids and pores which are viewable and measurable within the measured area from right above the top surface 12a, by a surface area of the measured area. The measurement is performed in the same manner as in the layered unit 1.

Piezoelectric ceramics used as a material for the first member 12 include lead zirconate titanates (PZTs), lead magnesium niobates (PMNs), and ceramics containing one or more of these salts as a main ingredient.

It is preferable to treat the top surface 12a of the first member 12 with plasma to form the microprotrusions 12p on the top surface 12a, as well as removing dusts, moistures, or the like which have been adhered on the top surface therefrom (cleaning with plasma).

Conventional plasma treatment, however, merely performs cleaning. The conventional plasma treatment fails to form microprotrusions 12p on the crystalline part of the top surface 12a. In order to form a multitude of microprotrusion 12p on the crystalline part constituting the top surface 12a, it is required to treat the top surface 12a by specifically selecting kinds of gases to generate plasma (oxygen gas, nitrogen gas, argon gas, and a mixed gas of oxygen and inert gas, etc.) and discharging methods (frequency, source power, etc.), and by regulating gas flow rate, gas pressure, and irradiating time.

It is preferable to treat the surface with oxygen plasma. Surface treatment with oxygen plasma securely provides uniform formation of microprotrusions on the top surface 12a of the piezoelectric ceramics plate 12 and provides a desired adhesive strength. Further, it is preferable to treat the surface with oxygen plasma under a condition of gas pressure: 5 Pa to 15 Pa, frequency: 13.56 MHz, power source: 500 W to 2 kW, irradiation time: 1 min to 20 min. Treatment with oxygen plasma under this condition enables to form microprotrusions substantially uniformly each having a height of 0.1 $\mu$m or loss over the crystalline part. Also, this treatment enables to sat the surface area ratio of microprotrusions relative to the measured area of the crystalline part from $10^{-6}$ to $10^{-5}$ mm$^2$ in the range from 5 to 40%.

The first member may directly be treated with oxygen plasma. Alternatively, treatment with oxygen plasma may be performed after forming recesses in the top surface of the first member. Recesses in the altered arrangement can be formed according to the same manner as in the first embodiment, The material used for the second member in the layered unit of the first embodiment can be used as a material for the second member in the second embodiment.

The material used for the adhesive agent in the layered unit of the first embodiment can be used for the adhesive agent in the layered unit of the second embodiment.

The layered unit having the above arrangement in the second embodiment is produced by: forming a multitude of microprotrusions on the crystalline part of the top surface of the first member by plasma treatment; applying an adhesive agent onto at least one of the top surface of the first member and a surface of the second member to adhere the first member and the second member to form an adhered unit; and curing the adhesive agent while pressurizing the adhered unit.

Alternatively, it may be possible to form recesses in the top surface of the first member in the similar manner as in the first embodiment prior to plasma treatment to obtain the altered arrangement in which recesses and microprotrusions are formed in the top surface of the first member.

According to this invention, forming a multitude of recesses having a surface area ratio thereof relative to the top surface of the first member at 50% or more (first embodiment) and/or forming a multitude of microprotrusions on the crystalline part of the top surface of the first member (second embodiment) enables to enhance spreadability of adhesive agent applied onto the top surface to thereby suppress cell content in the adhesive layer, and enables to improve an adhesive strength of the first member to the second member. The reason for improving spreadability of the adhesive a by provision of microprotrusions and/or recesses has not been elucidated. However, the improvement can be explained based on a relation of wettability between solid and liquid referring to FIG. 7.

Figure 7:
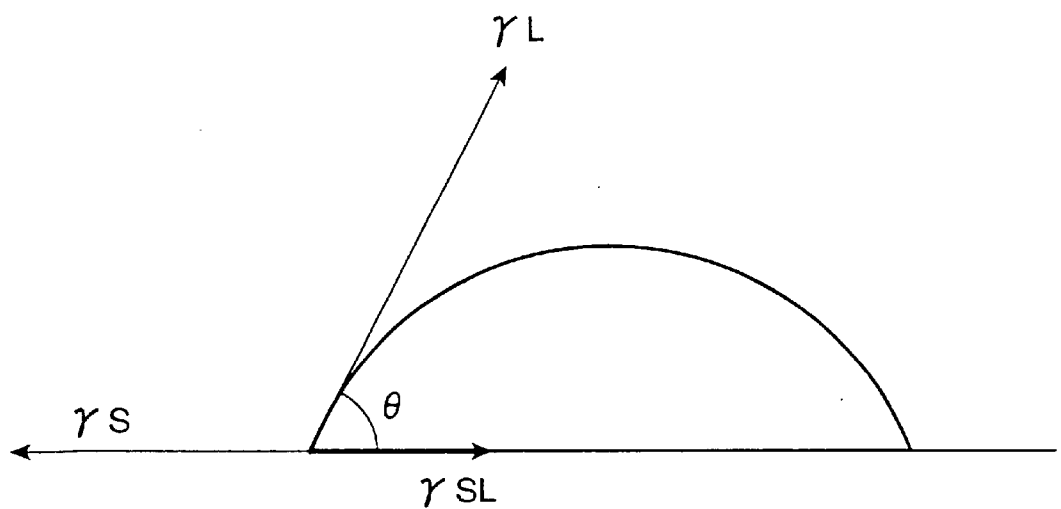
FIG. 7 is a schematic diagram for explaining application of a theory of wettability to this invention.

In FIG. 7, $\theta$ denotes a contact angle of liquid with respect to a boundary plane between liquid and solid, $\gamma L$ denotes a surface energy of liquid, $\gamma S$ denotes a surface energy of solid, and $\gamma SL$ denotes a surface energy of the boundary plane between solid and liquid. Generally, it is known that the following formula its established with respect to the contact angle ($\theta$), surface energy ($\gamma L$) of liquid, surface energy ($\gamma S$) of solid, and surface energy ($\gamma SL$) of the boundary between solid and liquid:

$$\gamma s = \gamma SL + \gamma L \cdot \cos \theta$$

It is understood that according to the formula, increasing wettability raises spreadability of adhesive agent as liquid. The smaller the contact angle ($\theta$) of liquid is, the more the wettability can be raised. Accordingly, it is understood that increasing surface energy ($\gamma S$) of solid, or decreasing surface, energy ($\gamma SL$) of the boundary plane between solid and liquid as well as surface energy ($\gamma L$) of liquid is preferable.

In the layered unit of the second embodiment, the surface area of the top surface 12a increases due to the existence of recesses and/or microprotrusions, which resultantly raises the surface energy ($\gamma S$) of the first member 12 as a solid. As a result, contact angle ($\theta$) of the adhesive agent as a liquid can be made smaller, and enhanced is wettability of adhesive agent, compared with a conventional layered unit in which a member corresponding to the first member without microprotrusions or recesses on the crystalline part of the top surface.

The layered unit as the first and second embodiments has a two-piece-one-unit construction such that a first member and second member are placed one over the other to form a unit. Alternatively, the construction may be a three-piece-one-unit construction such that a third member is placed under the bottom surface of the first member 2a (12a) so that the first member 2 (12a) in interposed between the second member 3 (13) and the third member. As an altered form, a plurality of sub-units each having the above two-piece-one-unit may be arrayed in a certain direction. In both of the cases, setting the surface area ratio of recesses relative to the top surface of the first member composed of piezoelectric ceramics at 50% or more, and/or forming a multitude of microprotrusions on the crystalline part of the top surface of the first member enables to raise the adhesive strength of the adhesive layer.

The layered unit having the above construction is used as

The layered unit having the above construction is used as a constituent element for actuators, buzzers, and diaphragms. Kinds of constructions as to how the first member and the second member are assembled, kinds of adhesive agents, dimensions of the first and second members can be optimally selected according to needs. A direction (thickness direction, lengthwise direction, or widthwise direction) of polarization of piezoelectric ceramics composing the first member can be optimally determined according to purpose of use and method of using.

For instance, in the case where a layered unit is used as part for a buzzer, a piezoelectric ceramics plate made of lead zirconate titanate or its equivalent which has a thickness from 0.1 mm to 1.5 mm and has a polarization in the thickness direction is used as the first member. The second member is the one selected from ceramics plates including insulating ceramics made of alumina, zirconia, forsterite, or silicon nitride, and piezoelectric ceramics, as well as metallic plates and resinous plates having a thickness ranging from 0.5 mm to 2 mm. The adhesive layer is made of a thermosetting adhesive agent having conductivity. An electrode is formed on the surface opposite to the top surface of the first member in the form of a film of silver, gold, platinum, nickel, copper, aluminum, tin, etc., or an alloy thereof by deposition, plating, ion plating, or sputtering. When a voltage is applied between the electrode of the first member and the adhesive layer, the first member is deformed in the thickness direction thereof. Turning on and off the voltage cyclically causes vibrations due to deformations, thus enabling the layered unit to function as a buzzer.

[Ink Jet Printing Head]

Next, an ink jet printing head incorporated with the layered unit of this invention is described with reference to FIGS. 8 through 10B.

Figure 8:
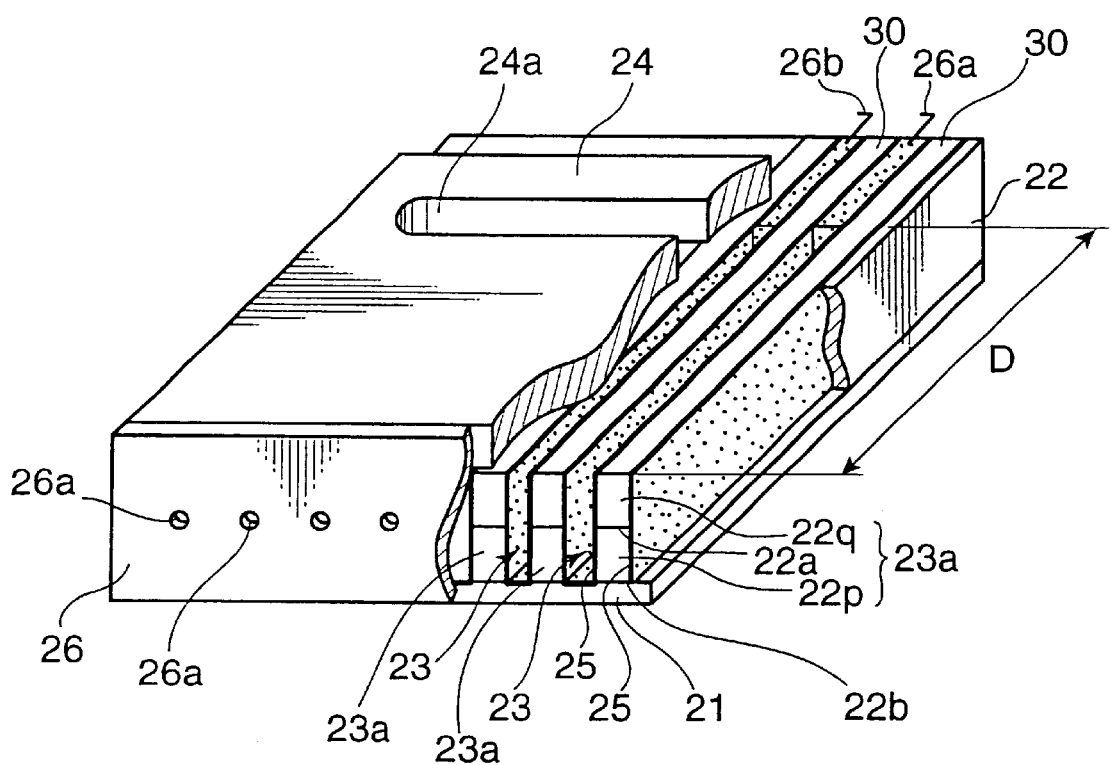
FIG. 8 is a schematic diagram showing a construction of an ink jet printing head embodying this invention.

FIG. 8 is a partially broken perspective view of an ink jet printing head embodying this invention. Note that leftward/rightward direction on the plane of FIG. 8 is widthwise direction of the printing head, and forward/backward direction on the plane of FIG. 8 is longitudinal direction of the printing head.

In FIG. 8, a plate-like piezoelectric member 22g is adhered to a base plate 21. The piezoelectric member 22 is formed with a series of cutaways 23 each having a length D and spaced away from one another in the widthwise direction at a certain interval. Thereby, each pair of partition walls 23a, 23a corresponding to the cutaway 23 are formed. The pairs of partition walls 23a, 23a constitute the piezoelectric member 22. A top plate 24 is provided on the piezoelectric member 22 to cover top openings of the cutaways 23 of the piezoelectric member 22. A nozzle plate 26 is attached to the piezoelectric member 22 at one longitudinal end thereof to cover side openings of the cutaways 23 at the one longitudinal end. The nozzle plate 26 is formed with a number of ink outlet ports 26a aligned in the widthwise direction. Each of the ink outlet ports 26a is communicated with the corresponding cutaway 23. The top plate 24 is formed with an ink inlet port 24a extending in the widthwise direction. The ink inlet port 24a is communicated with all of the cutaways 23.

With this arrangement, each cutaway 23 constitutes an ink flow channel along which ink supplied through the ink inlet port 24a is ejected to the corresponding ink outlet port 26a. In other words, each ink flow channel is defined by part of the base plate 21, part of the top plate 24, and each pair of partition walls 23a, 23a which are arrayed opposed to each other in the widthwise direction at the certain interval.

A surface of the opposing pair of partition walls 23a, 23a each constituting a side wall of the ink flow channel, and a top surface of the base plate 21 constituting a bottom surface of the ink flow channel are covered with a metallic thin film to form an electrode 25.

The piezoelectric member 22 is adhered on the base plate 21 by an adhesive agent. (i) Forming a multitude of recesses in a bottom surface 22b of the piezoelectric member 22 which is to be adhered to the base plate 21 in such a manner that the surface area ratio of the recesses relative to the surface of the bottom surface 22b is set at 50% or more, and/or (ii) forming a multitude of microprotrusions on a crystalline part of the bottom surface 22b enables to increase an adhesive strength of the piezoelectric member 22 to the base plate 21.

Insulating plates obtained by insulating metallic plates made of molybdenum, titanium, etc. with an insulating material, ceramics plates such as plates made of zirconia or alumina, and plastic plates such as plates made of ABS or acrylic resin can be used as the base plate 21.

A plate-like piezoelectric ceramics plate can be used as the piezoelectric member 22. It is preferable, however, to use a layered unit constructed according to this invention.

More specifically, as shown in FIG. 8, it is preferable to use a layered unit having an arrangement that a first member 22p made of piezoelectric ceramics and a second member 22q placed over the first member 22p are adhered by an adhesive agent. A multitude of recesses are formed in the top surface of the first member 22p in such a manner that the surface area ratio thereof is set at 50% or more relative to the surface area of the top surface to raise the adhesive strength of the first member 22p to the second member 22q. Alternatively, a multitude of microprotrusions are formed on the crystalline part of the top surface of the first member 22p to raise the adhesive strength of the first member 22p to the second member 22q.

It is preferable to use lead zirconate titanates (PZTs), lead magnesium niobates (PMNs), lead nickel niobates (PNNs), or piezoelectric ceramics containing one or more of these salts as a main ingredient, for the first member 22p which is placed over the base plate 21.

The material used for the second member 3 (13) of the layered unit of this invention can be used as the second member 22q. Preferably, however, the second member 22q may be made of the same material as the first member 22p.

In the case where the second member 22q is made of piezoelectric ceramics, it is preferable to form a multitude of recesses in a top surface (joint surface) of the second member 22q which is to be jointed to the top plate 24 in such a manner that the surface area ratio of the recesses is set at 50% or more relative to the surface area of the joint surface of the second member 22q. Alternatively, it is preferable to form a multitude of microprotrusions on the crystalline part of the joint surface of the second member 22q and to adhere the second member 22q and the top plate 24 by a thermosetting adhesive agent.

Joint surfaces 22 and 22b of the first member 22p which are respectively adhered to the second member 22q and the base plate 21 may be subjected to the same surface processing as in the aforementioned manner to raise the adhesive strength of the joint surface 22a relative to the second member 22q, and the adhesive strength of the joint surface 22b relative to the base plate 21. For instance, the joint surface 22a (22b) is formed with a multitude of recesses having a surface area ratio of the recesses relative to the joint surface 22a (22b) at 50% or more. Alternatively, the joint surface 22a (22b) is formed with a multitude of a microprotrusions on the crystalline part of the joint surface 22a (22b). As a further altered arrangement, the joint surface 22a is formed with a multitude of microprotrusions on the crystalline part thereof, while the joint surface 22b is formed with a multitude of recesses having a surface area ratio of the recesses relative to the joint surface 22b at 50% or more. One of these processes is optimally selected according to the material for the first member 22p, the second member 22q, and the base plate 21.

It is preferable to form polarization of the piezoelectric member 22 in a thickness direction thereof. This is because the ink jet printing head having the above arrangement of this invention provides a great variation in pressure due to an action of deformation by shearing force, which is described below, each time when a voltage is applied in a direction orthogonal to the polarizing direction of the piezoelectric member, thereby assuring a high ink emission rate through the ink outlet ports 20a after flowing along the ink flow channels.

The top plate 24 is made of a material such as forsterite, steatite, and alumina. The ink inlet port 24a may be a long slit extending in the widthwise direction of the ink jet printing head to be communicable with all the ink flow channels. Alternatively, the ink inlet port 24a may comprise a number of openings each communicable with a corresponding one of ink flow channels.

The electrode 25 is a thin film formed on the opposing side surfaces and the bottom surface of the ink flow channel, and is made of a metal such as platinum, gold, palladium, rhodium, nickel, and aluminum, or an alloy of platinum and gold, palladium and silver, and platinum and palladium as a main component. The electrode 25 is liable to be subjected to corrosion due to contact with ink. Accordingly, it is preferable to shield the electrode 25 with a protective layer such as a resinous film of polyparaxylene or a film of silicon nitride.

The electrode 25 is obtained by forming metallic thin films on the side surfaces of the ink flow channel (namely, the partition walls 23a) and the bottom surface of the ink flow channel (namely, the top surface of the base plate 21), respectively. For instance, the upper surface of the piezoelectric member 22 constituting the partition walls 23a is masked with an insulating material in a state that the piezoelectric member 22 is adhered on the base plate 21. Then, the exposing surfaces of the piezoelectric member 22 and the base plate 21 are shielded with the metal by vapor deposition or sputtering, or its equivalent. Thus, the piezoelectric member 22 is brought to a state where a voltage is applicable between the opposing surfaces of each partition wall 23a. Thereafter, a masked portion of the piezoelectric member 22 is removed, and the top plate 24 is jointed to the piezoelectric member 22. In FIG. 8, reference number 30 denotes a masked portion of each partition wall 23a.

The electrodes 25, 25 respectively formed on the opposing side surface of each partition wall 23a are connected to a driver circuit (not shown) by wires 26a, 26b respectively.

Next, an example of producing process of the ink jet printing head having the above construction is described.

First, the piezoelectric member 22 is adhered onto the base plate 21 by an adhesive agent. At this time, the joint surface 22b of the piezoelectric member 22 to be jointed to the base plate 21 is formed with a multitude of recesses or microprotrusions. At least one cutaway is formed on the piezoelectric member 22 by, e.g., a diamond wheel. When forming the cutaway 23 serving as an ink flow channel, a stress is exerted on the joint part where the piezoelectric member 22 and the base plate 21 are adhered, and a stress is exerted on the joint part where the first member 22p and the second member 22q are adhered in the case where the piezoelectric member 22 is made of piezoelectric ceramics. These joint parts have a great adhesive strength, as described in the section of [Piezoelectric Ceramics Layered Unit]. Accordingly, there can be prevented a failure in the production process such that the partition wall 23a is displaced relative to the base plate 21 or that the second member 22q falls off from the first member 22p.

Figure 9:
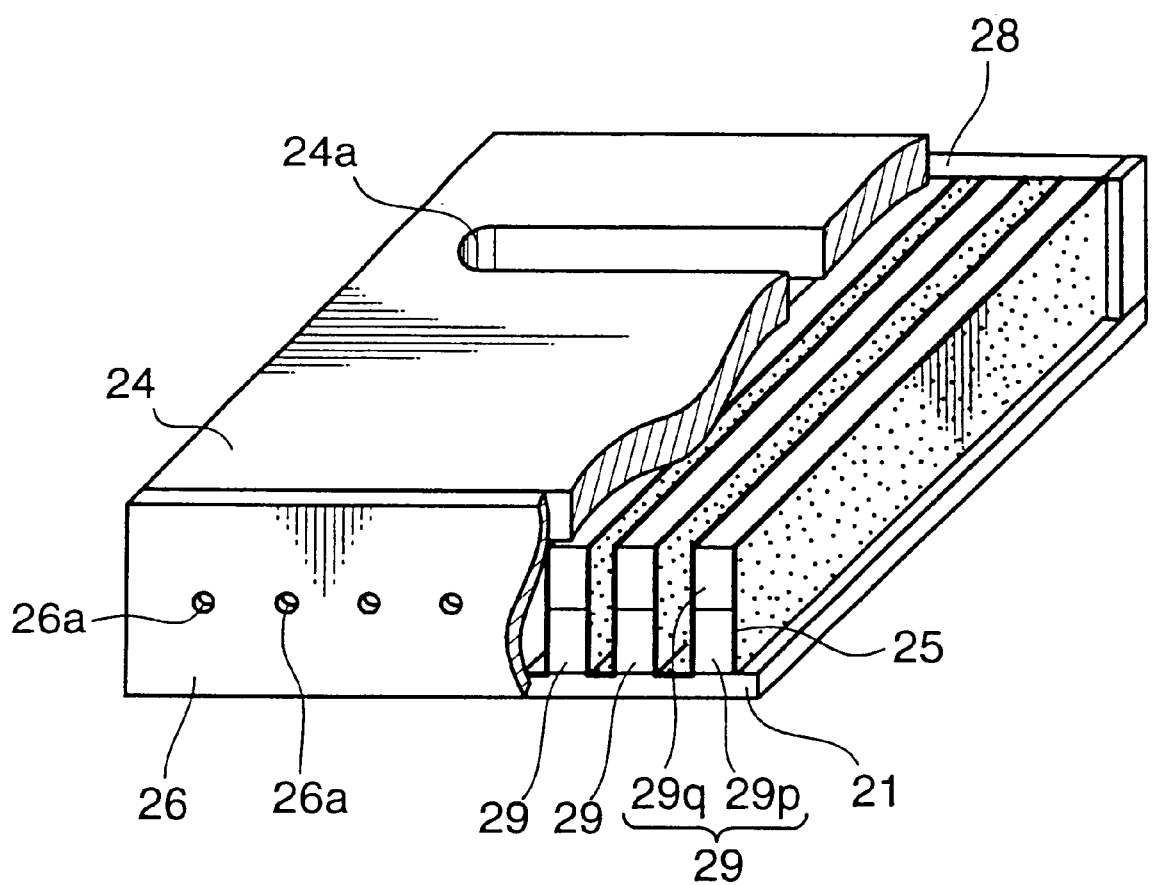
FIG. 9 is a schematic diagram showing a construction of an altered ink jet printing head of this invention.

Alternatively, in the case where the piezoelectric member 22 which has been formed with a number of cutaways 23 is adhered on the base plate 21 or a case where a number of longitudinally extending strip-like piezoelectric segments 29 for constituting ink flow channels are arrayed in the widthwise direction of the ink jet printing head at a certain interval as shown in FIG. 9, the aforementioned grinding process is not implemented.

FIG. 9 shows the altered arrangement where a number of piezoelectric segments 29 compose a piezoelectric member. In the altered arrangements, a remarkable effect of preventing failure in production process due, to increase of adhesive strength cannot be expected compared to the embodiment shown in FIG. 8. However, since the adhesive strength at the joint part of each piezoelectric segment 29 and the base plate 21, and at the joint part of a first member 29p and a second member 29q is increased, as described below. Accordingly, these altered arrangements also contribute to improvement of printing performance of the ink jet printing head.

In the altered arrangement of FIG. 9, a nozzle plate 26 formed with a number of ink outlet ports 26a blocks one longitudinal end of ink flow channels each defined by a pair of opposing partition walls 29, 29, while another member 28 blocks the opposite longitudinal end thereof. Thus, the ink flow channels are formed.

Figure 10A:
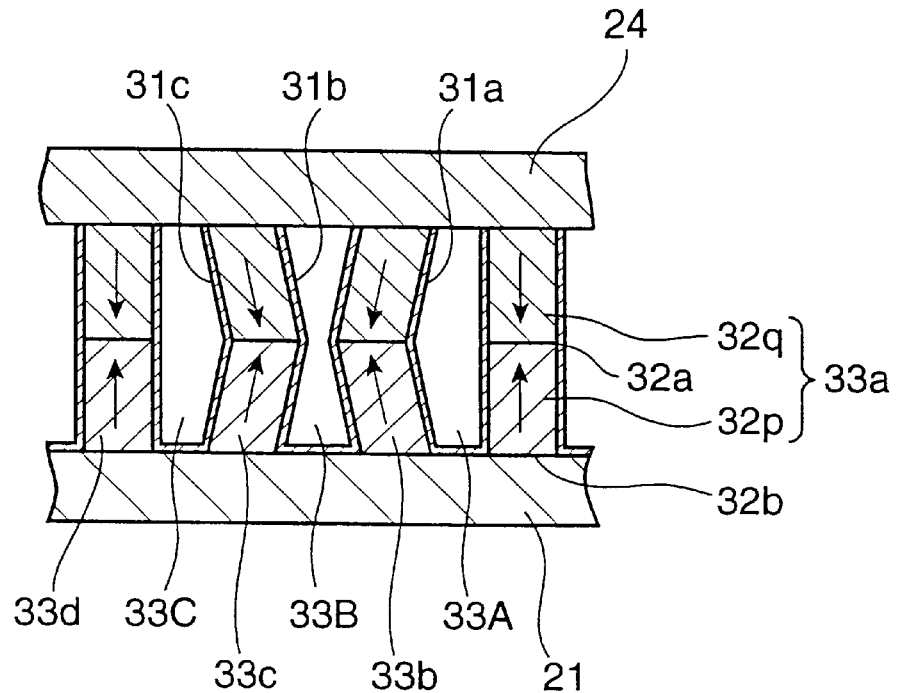
FIGS. 10A and 10B are schematic cross-sectional diagrams for explaining an operation of the inventive ink jet printing head.
Figure 10B:
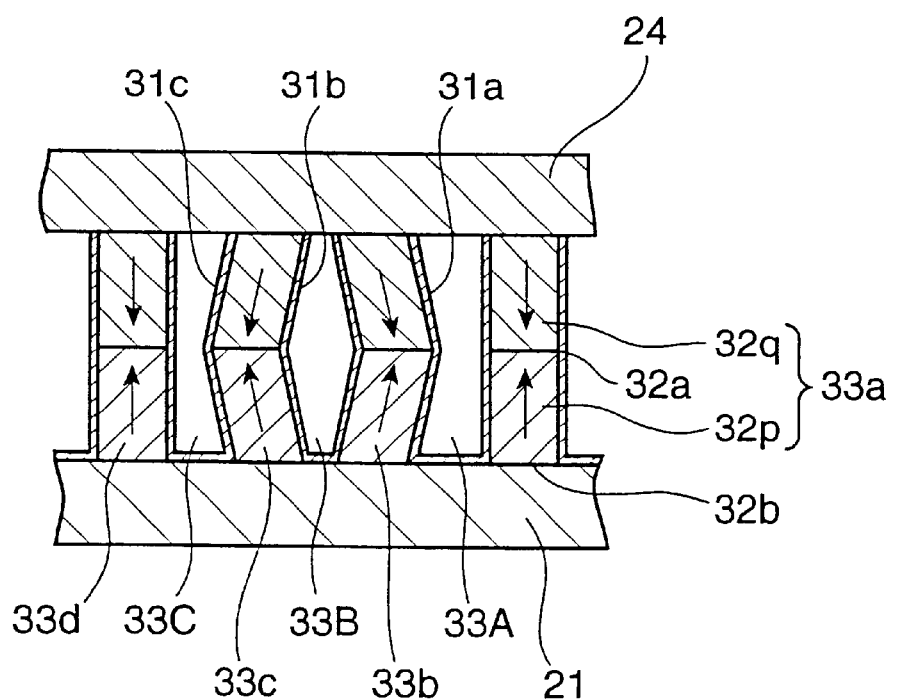

FIGS. 10A and 10B are partial sectional views of the ink jet printing head incorporated with the inventive layered unit as a piezoelectric member. In FIGS. 10A and 10B, the piezoelectric member has a configuration of a group of piezoelectric segments made of piezoelectric ceramics and a second member 32q made of piezoelectric ceramic in a state that the second member 32p is adhered on the first member 32p.

As shown in FIG. 10A, partition walls 33a, 33b, 33c, 33d are arrayed in a widthwise direction of the printing head at a certain interval on a base plate 21. Thus, an ink flow channel 33A is defined by the partition walls 33a and 33b, an ink flow channel 33B is defined by the partition walls 33b and 33c, and an ink flow channel 33C is defined by the partition walls 33c and 33d, respectively. Piezoelectric ceramics comprising the partition wall 33a (33b, 33c, and 33d) are polarized in directions shown by the arrows, namely, in a direction generally perpendicular to a direction or applying voltage (horizontal direction in FIGS. 10A and 10B).

Electrodes formed at the opposing surfaces of each partition wall are wired in such a manner as to be imparted with the opposite polarities to apply a voltage to each piezoelectric segment (namely, partition wall). In the case where portions of the base plate 21 corresponding to the bottom surfaces of the ink flow channels are shielded with a metallic thin film, each shielded surface is made electrically conductive with the opposing partition walls (namely, electricity passes over the opposing partition walls and the bottom surface).

For instance, as shown in FIG. 10A, a negative voltage is applied to an electrode 31b, and a positive voltage is applied to applied to an electrode 31b, and a positive voltage is applied to electrodes 31a, 31c. Thus, a voltage is applied in a direction orthogonal to the polarizing direction. As a result, the partition walls 38b, 33c composed of piezoelectric ceramics which define the ink flow channel 33B are subjected to deformation due to action of shearing force. This deformation is referred to as "shearing deformation".

Specifically, since the top surface of the partition walls 33b, 33c are fixed to the top plate 24, and the bottom surfaces thereof are fixed to the base plate 21, when the shearing force is exerted to the piezoelectric segments (namely, the partition walls 33b, 33c), the partition walls 33b, 33c are bent at a joint part 32a where the first member 32p and the second member 32q are adhered, as shown in FIG. 10A. More specifically, the partition walls 33b, 33c corresponding to the side walls of the ink flow channel 33B are resiliently displaced inwardly toward the ink flow channel 33B, thereby contracting the ink flow channel 33B. When the ink flow channel 33B is contracted in this way, ink in the ink flow channel 33B is pressurized to eject ink through a corresponding ink outlet port.

Next, another action of shearing deformation is described with reference to FIG. 10B. As shown in FIG. 10B, when the polarities of voltage to be applied to the electrodes 31a, 31b, 31c are inverted to those in FIG. 10A, the partition walls 33b and 33c are deformed in the direction opposite to that in FIG. 10A (outwardly away from the ink flow channel 33B). Namely, the partition wall 33b is deformed toward the ink flow channel 33A, and the partition wall 33c is deformed toward the ink flow channel 33C. Thereby, the ink flow channel 33B is depressurized to draw ink into the depressurized channel 33B through an ink inlet port (not shown) which is formed in the top plate 24.

During ink emission and ink supply operations due to deformative displacement of partition walls (piezoelectric segments), the adhesive strength of the joint surfaces between the first members 32p and second members 32q constituting the piezoelectric segments is secured. Accordingly, there is no likelihood that the piezoelectric segment is broken, or the first member 32p (second member 32q) is detached from the second member 32q (first member 32p), or the first member 32p is peeled off from the base plate 21. Further, when an improved adhesive strength is provided at a joint part between the top plate 24 and the second member 32q, there is no likelihood that the second member 32q is peeled off from the top plate 24.

This arrangement enables to provide an ink jet printing head having reliable ink emission and ink supply performance with improved durability despite repeated deformative displacements. Further, singe energy of deforming piezoelectric segments by shearing force can be converted to energy of deforming by bending force at the joint surface, the altered arrangement of ink jet printing head provides more deformation by handing compared to the embodiment where a one-piece piezoelectric unit is used. Thereby, the altered arrangement provides greater pressurization to the ink flow channels, thereby raising ink emission rate.

In place of the arrangement of the layered unit comprising a first member made of piezoelectric ceramics and a second member made of piezoelectric ceramics, a one-piece piezoelectric member can be used as part for the ink jet printing head of this invention. Since the one-piece piezoelectric member does not have a portion which is liable to be deformed by bending compared to the case where a two-piece or multi-layered unit comprising first and second members, degree of deformation by bending is small. In such a cases partially forming an electrode for applying a voltage to the one-piece piezoelectric member, e.g., on a surface of a partition wall enables to cause deformation by bending with case. Thus, even if a one-piece piezoelectric member is used in the ink jet printing head an adhesive strength of the joint surface between the base plate 21 and the piezoelectric member constituting the partition wall for the ink flow channel is secured, as well as securing the adhesive strength of the joint surface between the top plate 24 and the piezoelectric member. Accordingly, there can be prevented detachment of the piezoelectric member from the base plate 21 or the top plate 24 due to deformation by bending, and an ink jet printing head having reliable printing performance can be provided.

Figure 2:
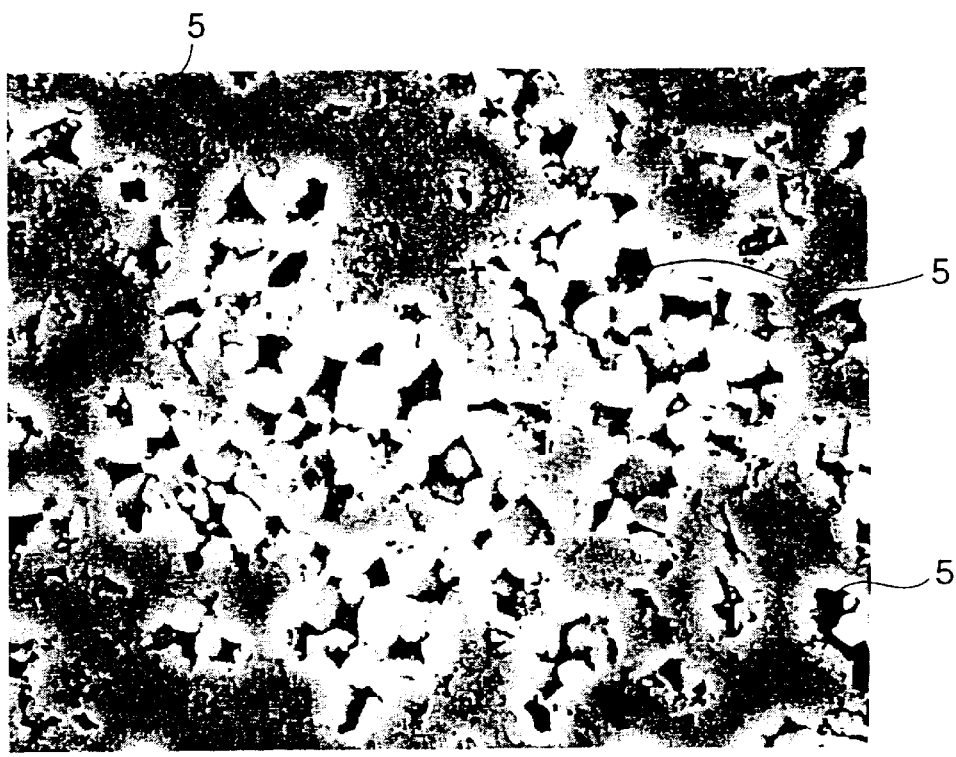
FIG. 2 is an SEM photograph taken by a scanning electron microscope (SEM) showing a state of a top surface of a first member composed of piezoelectric ceramic of the layered unit of the first embodiment.

The layered unit of this invention is not limited to those shown in FIG. 1 and 2. Also, the inventive ink jet printing head is not limited to those shown in FIGS. 8 and 9. This invention may be modified or altered in different ways as far as such modifications and alterations do not depart from the spirit of essential characteristics thereof.

In FIGS. 8 and 9, the ink inlet port is formed in the top plate, and the ink outlet parts are formed in the nozzle plate. Alternatively, the ink inlet port may be formed in a member other than the top plate (e.g., base plate), or the ink outlet port(s) may be formed in a member other than the nozzle plate (e.g., top plate). In the latter altered arrangement, a nozzle plate can be omitted.

EXAMPLE

Hereinafter, examples of the inventive layered unit and the inventive ink jet printing head incorporating the layered unit are described. It should be appreciated that the invention is not limited to the following examples.

[Piezoelectric Ceramics Layered Unit as First Embodiment]

Production of Piezoelectric Ceramics Layered Unit 11 piezoelectric ceramics plates each having a thickness of 0.7 mm, containing lead zirconate titanate (PZT) as main ingredient, and the content or $Al_2O_3$ and $SiO_2$ as respectively shown in Table 1 were prepared. An electrode film made of silver was formed on the opposite surfaces of each of the plates. A voltage was applied between the upper electrode and the lower electrode of each plate to polarize the opposite surfaces of each plate. Then, after removing the electrode films from each plate, the opposite surfaces of each plate were lapped with abrasive grains of silicon carbide having grain diameters respectively shown in Table 1. Thus, the piezoelectric ceramics plates (first members) respectively having surface area ratios as shown in Table 1 were produced.

The opposite surfaces (upper and bottom surfaces) of each of the first members were cleaned by a surface active agent, ion exchange water, isopropylalcohol, and acetone in this order. Then, an epoxy adhesive agent (product name: EPOTEK 353-ND) was coated on the upper surface of each of the first members according to a transfer method. After the coating of the adhesive agent, a second member was adhered to each of the first members. Thus, layered units corresponding to samples A to K were obtained. The second member was one of plates made of lead zirconate titanate (PZT) containing $Al_2O_3$ and $SiO_2$ as impurities, or a plate made of zirconia, or a plate made of molybdenum.

Each of the layered units were put in a vacuum chamber in a state that the units were pressurized in a thickness direction thereof. Then, each of the layered units was depressurized at 8 KPa and heated at a temperature from 100 to 150° C. to cure the epoxy adhesive agent to form an adhesive layer. The content of cells (cell occupy ratio) in the adhesive layer of each of the samples A to K was measured. The result of measurement is shown in Table 1.

A region where cells were formed was shown black in an image observed by an ultrasonic microscope (manufactured by Hitachi Kenki, Model HSAM) equipped with an ultrasonic probe at a frequency of 100 MHz, when an ultrasonic wave was irradiated focusing at a boundary between the first member (located at a lower side of the layered unit) and the adhesive layer. This is conceived because light reflected at the cell region is attenuated greater than regions other than the cell region. The ratio of the cell region represented by black image relative to the total surface area of the image measured by an image analyzer was calculated as a cell occupy ratio. The result of calculation of the cell occupy ratio of each of the samples A to K was shown in Table 1.

TABLE 1

| Sample No. | Grain diameter used for lapping (μm) | Piezoelectric ceramics plate Composition lead zirconate titanate (mass %) | Piezoelectric ceramics plate Composition $Al_2O_3$ + $SiO_2$ (mass %) | Piezoelectric ceramics plate SARR (%) | Second member Composition | Second member SARR (%) | Cell occupy ratio measured by image analyzer (%) |
|---|---|---|---|---|---|---|---|
| *A | 12 | 99.80 | 0.20 | 5 | PZT99.85%($Al_2O_3$ + $SiO_2$)0.15% | 12 | 11.5 |
| *B | 12 | 99.82 | 0.18 | 12 | PZT99.85%($Al_2O_3$ + $SiO_2$)0.15% | 12 | 9.5 |
| *C | 12 | 99.85 | 0.15 | 27 | PZT99.85%($Al_2O_3$ + $SiO_2$)0.15% | 12 | 5.0 |
| *D | 10 | 99.90 | 0.10 | 41 | PZT99.85%($Al_2O_3$ + $SiO_2$)0.15% | 12 | 3.8 |
| E | 5 | 99.92 | 0.08 | 52 | PZT99.92%($Al_2O_3$ + $SiO_2$)0.08% | 62 | 0.2 |
| F | 10 | 99.92 | 0.08 | 56 | PZT99.85%($Al_2O_3$ + $SiO_2$)0.15% | 12 | 2.8 |
| G | 5 | 99.92 | 0.08 | 52 | molybdenum | 0 | 1.2 |
| H | 5 | 99.92 | 0.08 | 52 | zirconia | 1 | 1.8 |
| I | 5 | 99.95 | 0.05 | 60 | PZT99.85%($Al_2O_3$ + $SiO_2$)0.15% | 12 | 0.8 |
| J | 5 | 99.99 | 0.01 | 75 | PZT99.85%($Al_2O_3$ + $SiO_2$)0.15% | 12 | 0.6 |
| *K | 2 | 99.95 | 0.05 | 40 | PZT99.85%($Al_2O_3$ + $SiO_2$)0.15% | 15 | 3.9 |

Remarks:
*denotes sample which does not satisfy the requirements of the invention.
SARR denotes surface area ratio of recesses relative to the measured surface area of the piezoelectric ceramics plate.

Samples E to J each having the surface area ratio of the recesses formed in the first member at 50% or more are inventive examples. Samples A to D, and K are comparative examples.

All of the comparative samples A to D, and K have the surface area ratio of the recesses less than 50% and the cell occupy ratio at 3% or more. This means that in the comparative examples, spreadability of adhesive agent at the time of coating of the adhesive agent to the first member, jointing the first member and the second member, and/or curing the adhesive agent was poor, which resultantly raised the cell occupy ratio in the adhesive layer formed by curing. As a result of poor adhesion, an adhesive strength of each of the comparative examples was insufficient.

On the other hand, samples E to J corresponding to inventive examples each has a cell occupy ratio in the adhesive layer less than 3%. Thus, a high adhesive strength is obtained in the samples E to J.

Further, the piezoelectric ceramics plate used as the first member in each of the samples E to J has the content of $Al_2O_3$ and $SiO_2$ as impurities at 0.08 mass % or less. Particularly, samples D and F are examples in which the first member was lapped with abrasive grains having a grain diameter of 10 μm. As shown in Table 1, sample F having less content of these impurities attains a surface area ratio of 50% or more. This proves that setting the content of $Al_2O_3$ and $SiO_2$ as impurities at 0.08 mass % or less easily attains the surface area ratio of 50% or more.

Based on the results of the samples E to J, it is clear that as far as the surface area ratio of the recesses relative to the joint surface of the first member is set at 50% or more, the resultant layered unit securely has a sufficient adhesive strength while suppressing the cell occupy ratio in the adhesive layer. In other words, a sufficient adhesive strength is obtained, even if the surface area ratio of the recesses relative to the joint surface of the second member does not reach 50%, and even if no recess is formed in the metallic plate as shown in sample G.

Production of Ink Jet Printing Head at First Embodiment:

Ink jet printing heads respectively incorporated with the layered units A to F, and I to K and having an arrangement at shown in FIG. 8 were produced according to the following procedure.

First, the layered unit was adhered to a plate made of alumina (base plate) by an epoxy adhesive agent. The piezoelectric ceramics part of the layered unit was machined with a diamond wheel with diamond abrasive grains of a grain diameter of 5 μm attached thereto at a grinding speed of 5 mm/sec to form 3,000 cutaways at an interval of 141 μm, thereby forming 3,000 ink flow channels each having a width of 75 μm.

After forming the cutaways, a judgement was made as to whether the first (second) member was peeled off from the adhesive layer of the layered unit constituting a partition wall, as well as a judgment as to whether the layered unit was peeled off from the base plate through a binocular microscope. The number of partition walls which have fallen off from the adhesive layer between the first member and the second member, or between the layered unit and the base plate was measured. The ratio of the peeled partition walls relative to the total number (3,001) of the partition walls was calculated as a peeling ratio. The result of measurement is shown in Table 2.

Next, a top surface of each partition well (namely, the surface of the second member which is not jointed to the first member) was performed with masking to apply a voltage between the opposite surfaces of each partition wall. Then, an electrode was formed in a longitudinal direction on opposing surfaces of adjacent partition walls (side walls of the corresponding ink flow channel) and on the top surface of the base plate (bottom surface of the ink flow channel). With this arrangement, the side walls of one ink flow channel (respective surfaces of the adjacent partition walls opposing each other) and the bottom surface thereof were formed into a unitary electrode, whereas the opposite surface of one of the adjacent partition walls was formed into another electrode by insulation due to masking at the top surface thereof. In this way, a pair of electrodes were formed. A number of pairs of electrodes were formed in the aforementioned manner. Wiring was performed with respect to each pair of electrodes. Formation of the electrodes and wiring were performed by sputtering aluminum.

Subsequently, a top plate made of alumina ceramics and formed with an ink inlet port was attached to the top surfaces of the partition walls. A nozzle plate formed with a number of ink outlet ports corresponding to the ink flow channels at one longitudinal end of the ink flow channels (cutaways of the layered unit) was adhered to the base plate and the top plate by an adhesive agent. In this way, an ink jet printing head was assembled. The adhesive agent was an epoxy adhesive agent. Ink jet printing beads incorporated with the layered units A to F, and I to K were identified as printing heads No. 1 to 9, respectively.

A voltage of 30 V was applied to pairs of electrodes for driving each of the printing heads No. 1 to 9. The partition walls of each of the printing heads Nos. 1 to 0 were deformed at a frequency of 8 kHz, and ink emissions of 1,000 million times were implemented. The number of ink outlet ports which showed ink emission failure after the ink emissions was calculated with respect to each of the printing heads Nos. 1 to 9. The ratio of ink outlet ports having ink emission failure relative to the total number of ink outlet ports was calculated as ink emission failure ratio. The result of calculation is shown in Table 2.

TABLE 2

| Printing head No. | Sample No. in Table 1 | Peeling ratio of partition walls (%) | Ink emission failure ratio (%) | General evaluation |
|---|---|---|---|---|
| *1 | A | 0.06 | 0.010 | X |
| *2 | B | 0.05 | 0.008 | X |
| *3 | C | 0.02 | 0.005 | X |
| *4 | D | 0.012 | 0.005 | X |
| 5 | E | 0.001 | 0 | ⊚ |
| 6 | F | 0.006 | 0.001 | ○ |
| 7 | I | 0.003 | 0 | ⊚ |
| 8 | J | 0.002 | 0 | ⊚ |
| *9 | K | 0.012 | 0.005 | X |

Remarks:
*denotes printing heads which does not satisfy the requirements of the invention.
⊚ denotes VERY GOOD, ○ denotes GOOD, X denotes NO GOOD.

As shown in Table 2, the inventive layered units E to J all have a peeling ratio at the time of forming cutaways less than 0.01%. It is clear from Table 2, the printing heads incorporated with these Samples E to J are free from ink emission failure as a result of ink emissions of 1,000 million times On the other hand, all the comparative samples A to D, and K show a peeling ratio of 0.01% or more at the time of forming cutaways. The printing heads incorporated with the comparative samples have an ink omission failure ratio of 0.005% or more as a result of ink emissions of 1,000 million times. This result shows that the comparative ink jet printing heads show poor reliability and durability in terms of printing performance [Piezoelectric Ceramics Layered Unit as Second Embodiment]

Production of Piezoelectric Ceramics Layered Unit:

Piezoelectric ceramics plates each having a thickness of 0.7 mm and containing lead zirconate titanate (PZT) as a main ingredient were prepared. A silver electrode film was formed on the opposite surfaces (upper and lower surfaces) of each of the plates. A voltage was applied between the upper electrode and the lower electrode of each plate to polarize the opposite surface of each plate. Then, after removing the electrode films from each plate, the opposite surfaces of each plate were lapped with abrasive grains of silicon carbide having a grain diameter of 5 µm. Thus, the surfaces of each plates were made flat and smooth having an arithmetic average roughness (Ra) from 0.1 to 0.3 µm and a flatness from 5 to 10 µm. The flat surfaces were washed with acetone.

Then, the opposite surfaces of each plate was subjected to plasma treatment to form a multitude of microprotrusions on a crystalline part thereof. Thus, piezoelectric ceramics plates (corresponding to samples B to T) were produced. The average diameter of microprotrusions and/or surface area ratio thereof which are to be formed on the opposite surfaces of each plate was changed by varying a condition for implementing the plasma treatment, as shown in Table 3.

In this experiment, the surface of each plate was treated with plasma generated from oxygen gas, at a gas pressure from 90 to 140 N·m$^{-2}$, frequency at 13.56 MHz, source power from 200 W to 600 W, and a plasma irradiation time of about 5 minutes. Sample B was obtained by implementing a conventional plasma treatment (gas pressure: 10 Pa, source power: 200 W) which is effective only in cleaning the surface.

The upper surface of each of the plates corresponding to samples B to T to which plasma treatment was implemented, and the plate corresponding to sample A to which plasma treatment was not implemented was coated with an epoxy adhesive agent (product name: EPOTEK 353-ND) by a transfer method. Thus, plates which have been processed as above were used as a first member. A second member made of piezoelectric ceramics containing lead zirconate titanate (PZT), zirconia ceramics, or molybdenum was adhered to the first member to form a layered unit. A joint surface of each of the second member to which the corresponding first member is adhered is made flat and smooth having an arithmetic average roughness (Ra) from 0.1 to 0.3 µm and a flatness from 5 to 10 µm.

Each of the layered units were put in a vacuum chamber in a state that the units were pressurized in a thickness direction thereof. Then, each of the layered units was depressurized at 8 KPa and heated at a temperature from 100 to 150° C. to cure the epoxy adhesive agent to form an adhesive layer. Thus, samples (layered units) A to T were produced.

The content of cells in the adhesive layer of each of the samples A to T was numbered as a cell occupy ratio. The result of measurement is shown in Table 3.

The cell occupy ratio of the samples A to T as the second embodiment was measured in the same manner as in the layered units as the first embodiment.

TABLE 3

| | | Piezoelectric ceramics plate | | | |
|---|---|---|---|---|---|
| Sample No. | Oxygen plasma treatment | Average diameter of micro-protrusions ($\mu$m) | SAR of micro-protrusions (%) | Material for second member | Cell occupy ratio in adhesive layer (%) |
| A* | not applied | 0 | 0 | PZT | 12.5 |
| B | applied | 0 | 0 | PZT | 5.0 |
| C | applied | 0.01 | 5 | PZT | 0.6 |
| D | applied | 0.03 | 10 | PZT | 0.5 |
| E | applied | 0.05 | 5 | PZT | 0.3 |
| F | applied | 0.05 | 10 | PZT | 0.2 |
| G | applied | 0.05 | 10 | molybdenum | 0.4 |
| H | applied | 0.05 | 10 | zirconia | 0.4 |
| I | applied | 0.05 | 20 | PZT | 0.4 |
| J | applied | 0.05 | 30 | PZT | 0.8 |
| K | applied | 0.05 | 40 | PZT | 0.9 |
| L | applied | 0.05 | 50 | PZT | 1.3 |
| M | applied | 0.05 | 60 | PZT | 1.5 |
| N | applied | 0.05 | 80 | PZT | 3.7 |
| O | applied | 0.07 | 10 | PZT | 0.5 |
| P | applied | 0.08 | 10 | PZT | 0.8 |
| Q | applied | 0.10 | 10 | PZT | 0.9 |
| R | applied | 0.12 | 10 | PZT | 1.2 |
| S | applied | 0.16 | 10 | PZT | 2.9 |
| T | applied | 0.20 | 10 | PZT | 3.2 |

Remarks:
*denotes sample of prior art.
PZT denotes piezoelectric ceramics containing lead zirconate titanate as main ingredient.
SAR denotes surface area ratio.

As is clear from Table 3, sample A to which plasma treatment was not performed, and sample B to which plasma treatment was performed under a condition substantially effective only in cleaning the surface were not formed with microprotrusions on the crystalline part of the joint surface of the piezoelectric member. Accordingly, spreadability of adhesive agent at the time of curing was poor, with the result that a large number of cells were contained in the adhesive layers of samples A and B.

On the other hand, the samples C to T each having a multitude of microprotrusions on the crystalline part of the joint surface of the layered unit have improved spreadability of adhesive agent at the time of curing. Accordingly, the cell occupy ratio in the adhesive layer after the curing was remarkably lowered.

Particularly, the samples C to K, and O to Q have a surface area ratio of microprotrusions ranging from 5 to 40% with an average diameter of microprotrusions of 0.1 $\mu$m or less. Accordingly, spreadability of adhesive agent at the time of curing was remarkably improved. As a result, the cell occupy ratio in the adhesive layer after the curing was suppressed as low as 1% or less.

Production of Ink Jet Printing Heads as Second Embodiment:

Ink jet printing heads respectively incorporated with the layered units A, B, F, and K and each having the arrangement shown in FIG. 8 were produced according to the following procedure.

A method of assembling ink jet printing heads with use of the layered units A, B, F, and K as the second embodiment is similar to the one of assembling the ink jet printing heads with use of the layered units at the first embodiment. Each of the layered units A, B, F, and K were adhered to a base plate. After the adhesion, the layered unit was formed with a number of cutaways to form ink flow channels. After forming electrodes, a top plate and a nozzle plate were adhered to the layered unit and the base plate. In this way, ink jet printing heads Nos. 11 to 14 were produced.

Ink emission test was implemented to the printing heads Nos. 11 to 14 in the same manner as in the ink jet printing heads of the first invention, and an ink emission failure ratio was calculated in the same manner as in the printing heads of the first embodiment. The result of calculation is shown in Table 4.

TABLE 4

| Printing head No. | Sample No. in Table 3 | Peeling ratio of partition walls (%) | Ink emission failure ratio (%) | General evaluation |
|---|---|---|---|---|
| 11* | A | 0.060 | 0.012 | X |
| 12* | B | 0.025 | 0.007 | X |
| 13 | F | 0.001 | 0 | ⊚ |
| 14 | K | 0.004 | 0.001 | ○ |

Remarks:
*denotes sample of prior art.
⊚ denotes VERY GOOD, ○ denotes GOOD, and X denotes NO GOOD.

As is obvious from Table 4, the printing heads Nos. 11 and 12 do not have microprotrusions on the joint surface between the base plate and the first member of the piezoelectric layered unit, and accordingly, an adhesive strength thereat is low. As a result, a peeling ratio at the joint part between the base plate and the partition walls, and at the joint part between the first member and the second member at the time of forming ink flow channels exceeds 0.01%. Further, the printing heads No. 11 and 12 have an ink emission failure ratio of 0.005% or more after ink emissions of 1,000 million times. Thus, the printing heads Nos. 11 and 12 show poor reliability and durability in the aspect of printing performance.

On the other hand, the printing heads Nos. 13 and 14 are incorporated with the layered unit in each of which a multitude of microprotrusions are formed on the joint surface between the base plate and the first member of the piezoelectric member, and a multitude of microprotrusions on the joint surface between the first member and the second member. Accordingly, the printing heads Nos. 13 and 14 have a pooling ratio as low as 0.005% or less at the joint part between the base plate and the partition walls and at the joint part between the first member and the second member at the time of forming the ink flow channels. Further, the printing heads Nos. 13 and 14 have a low ink emission failure ratio of 0.001% or less after ink emissions of 1,000 million times. Thus, it was proved that using the layered unit as the second embodiment also provides ink jet printing performance of a high reliability and durability.

Also, the printing head No. 13 incorporated with the layered unit having a surface area ratio of microprotrusions of 10% exhibits higher adhesive strength than the printing head No. 14 incorporated with the layered unit K having a surface area ratio of microprotrusions of 40% (see Table 3). The printing head No. 13 has a lower peeling ratio of 0.001% than the printing head No. 14 at the time of forming cutaways. The printing head No. 13 shows no ink emission failure after ink emissions of 1,000 million times.

To summarize this invention, as mentioned above, the inventive layered unit formed with a multitude of recesses having a surface area ratio thereof relative to the total surface area of the joint surface at 50% or more, or formed with a multitude of microprotrusions on a crystalline part thereof enables to raise the adhesive strength of the layered unit while lowering cell content in the adhesive layer of the layered unit. Accordingly, there can be provided vibrators, actuators, and its equivalent having improved durability by using the inventive layered unit.

Further, the inventive ink jet printing head is constructed in such a manner that a piezoelectric member serving as an actuator and a base plate are adhered one over the other wherein a joint surface of the piezoelectric member which is to be jointed to the base plate is formed with a multitude of recesses having a surface area ratio thereof at 50% or more, and/or is formed with a multitude of microprotrusions on a crystalline part thereof. With this arrangement, the adhesive strength of the adhesive layer at the joint surface is raised while lowering a cell occupy ratio in the adhesive layer. As a result, suppressed is occurrence of assembly failure such as peeling off of the piezoelectric member from the base plate at the time of forming cutaways to define ink flow channels. Further, the printing head thus formed provides high durability against repeated deformations of piezoelectric member due to continual ink emission operations, thereby securing high ink emission performance for a prolonged period.

Furthermore, polarizing a piezoelectric member in a direction perpendicular to a direction of applying a voltage thereto in the layered unit having the aforementioned arrangement enables to raise ink emission rate while securing greater durability against repeated deformations by bending.

This application is based on patent application Nos. 2000-227824 and 2000-385445 filed in Japan, the contents of which are hereby incorporated by references.

As this invention may be embodied in several forms without departing from the spirit of essential characteristics thereof, the present embodiment is therefore illustrative an not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A layered unit provided with piezoelectric ceramics comprising:

a first member made of piezoelectric ceramics;
   a second member which is placed on the first member; and
   an adhesive layer which is formed between the first member and the second member to adhere the first member and the second member, wherein
   a joint surface of the first member to be jointed to the second member is formed with a multitude of recesses formed by shedding of crystalline grains following breaks in grain boundaries between crystalline trains of the piezoelectric ceramics of the first member, a surface area ratio of the recesses relative to a total surface area of the joint surface being 50% or more.

2. The layered unit according to claim 1, wherein the grain boundary of the crystalline grains of the first member includes a glass phase primarily containing $PbO$—$Al_2O_3$—$SiO_2$.

3. The layered unit according to claim 1, wherein the recesses include voids in the joint surface of the first member.

4. The layered unit according to claim 1, wherein the piezoelectric ceramics composing the first member includes alumina ($Al_2O_3$) and silicon oxide ($SiO_2$) in such an amount that a content thereof relative to the piezoelectric ceramics composing the first member is 0.08 mass % or less.

5. The layered unit according to claim 4, wherein the piezoelectric ceramics composing the first member includes lead zirconate titanate as a main component.

6. A method of producing a layered unit provided with piezoelectric ceramics having an improved adhesive strength comprising steps in the order of:

lapping a surface of a first member made of piezoelectric ceramics including lead zirconate titanate in which a total content of alumina ($Al_2O_3$) and silicon oxide ($SiO_2$) relative to the piezoelectric ceramics is 0.08 mass % or less, with abrasive grains of silicon carbide having a grain diameter ranging from 5 to 10 $\mu$m as free abrasive grains to form a joint surface to be jointed to a second member;
   applying an adhesive agent to at least one of the joint surface of the first member and a surface of the second member to form a joint unit of the first member and the second member; and
   curing the adhesive agent while pressurizing the joint unit.

7. A method of producing a layered unit provided with piezoelectric ceramics having an improved adhesive strength comprising steps in the order of:

machining a surface of a first member made of piezoelectric ceramics including lead zirconate titanate in which a total content of alumina ($Al_2O_3$) and silicon oxide ($SiO_2$) relative to the piezoelectric ceramics is 0.08 mass % or less, with a diamond wheel to which diamond grains having a grain diameter ranging from 5 to 10 $\mu$m are attached to form a joint surface of the first member to be jointed to a second member;
   applying an adhesive agent to at least one of the joint surface of the first member and a surface of the second member to form a joint unit of the first member and the second member; and
   curing the adhesive agent while pressurizing the joint unit.

8. A layered unit provided with piezoelectric ceramics comprising:

a first member made of piezoelectric ceramics;
   a second member which is placed on the first member; and an adhesive layer which is formed between the first member and the second member to adhere the first member and the second member, wherein
a joint surface of the first member to be jointed to the second member is formed with a multitude of microprotrusions which have the same composition as crystalline grains of the piezoelectric ceramics and have a height of 0.1 µm or less.

9. The layered unit according to claim 8, wherein a surface area ratio of the microprotrusions relative to a measured surface area of the joint surface from $10^{-6}$ to $10^{-5}$ mm² ranges from 5 to 40%.

10. A method of producing a layered unit provided with piezoelectric ceramics having an improved adhesive strength comprising steps in the order of:
treating a surface of a first member with plasma to form a multitude of microprotrusions thereon so as to form a joint surface of the first member to be jointed to a second member;
applying an adhesive agent to at least one of the joint surface of the first member and a surface of the second member to form a joint unit of the first member and the second member; and
curing the adhesive agent while pressurizing the joint unit.

11. The method according to claim 10, wherein the surface treatment with the plasma is performed after a step of machining or polishing the surface of the first member.

12. An ink jet printing head comprising:
a base plate;
an array of ink flow channels each defined by a pair of partition walls each including piezoelectric ceramics made of crystalline grains to constitute a piezoelectric member, the ink flow channels being arrayed on the base plate in a widthwise direction of the ink jet printing head at a certain interval; and
pairs of electrodes each provided at opposing sides of each partition wall to apply a voltage to deform the partition wall, wherein
a multitude of recesses are formed in a joint surface of the partition wall to be jointed to the base plate by shedding of crystalline grains following breaks in grain boundaries between crystalline grains of the piezoelectric ceramics of the partition wall, a surface area ratio of the recesses relative to a total surface area of the joint surface is set at 50% or more, and the partition wall and the base plate are jointed by an adhesive agent.

13. The ink jet printing head according to claim 12, further comprising a top plate attached to upper surfaces of the partition walls, wherein a joint surface of the partition wall to be jointed to the top plate is formed with a multitude of recesses having a surface area ratio of thereof relative to a total surface area of the joint surface at 50% or more.

14. The ink jet printing head according to claim 12, further comprising a top plate attached to upper surfaces of the partition walls, wherein a joint surface of the partition wall to be jointed to the top plate is formed with a multitude of microprotrusions on a crystalline part thereof.

15. The ink jet printing head according to claim 12, wherein the partition wall comprises:
a first member made of piezoelectric ceramics;
a second member which is placed on the first member; and
an adhesive layer which is formed between the first member and the second member to adhere the first member and the second member,
a joint surface of the first member to be jointed to the second member being formed with a multitude of recesses having a surface area ratio thereof relative to a total surface area of the joint surface of 50% or more.

16. The ink jet printing head according to claim 12, wherein the partition wall comprises:
a first member made of piezoelectric ceramics;
a second member which is placed on the first member; and
an adhesive layer which is formed between the first member and the second member to adhere the first member and the second member,
a joint surface of the first member to be jointed to the second member being formed with a multitude of microprotrusions on a crystalline part thereof.

17. The ink jet printing head according to claim 12, wherein the partition wan is polarized in a direction perpendicular to a direction of applying a voltage thereto.

18. The ink jet printing head according to claim 12, wherein the partition wall is constructed by forming at least one cutaway having a certain length in a piezoelectric plate adhered to the base plate.

19. An ink jet printing head comprising:
a base plate;
an array of ink flow channels each defined by a pair of partition walls each including piezoelectric ceramics made of crystalline grains to constitute a piezoelectric member, the ink flow channels being arrayed on the base plate in a widthwise direction of the ink jet printing head at a certain interval; and
pairs of electrodes each provided at opposing sides of each partition wall to apply a voltage to deform the partition wall, wherein
a multitude of microprotrusions which are formed in a joint surface of the partition wall to be jointed to the base plate and have the same composition as crystalline grains of the piezoelectric ceramics and have a height of 0.1 µm or less, and the partition wall and the base plate are jointed by an adhesive agent.

20. The ink jet printing head according to claim 19, further comprising a top plate attached to upper surfaces of the partition walls, wherein a joint surface of the partition wall to be jointed to the top plate is formed with a multitude of recesses having a surface area ratio of thereof relative to a total surface area of the joint surface at 50% or more.

21. The ink jet printing head according to claim 19, further comprising a top plate attached to upper surfaces of the partition walls, wherein a joint surface of the partition wall to be jointed to the top plate is formed with a multitude of microprotrusions on a crystalline part thereof.

22. The ink jet printing head according to claim 19, wherein the partition wall comprises:
a first member made of piezoelectric ceramics;
a second member which is placed on the first member; and
an adhesive layer which is formed between the first member and the second member to adhere the first member and the second member,
a joint surface of the first member to be jointed to the second member being formed with a multitude of recesses having a surface area ratio thereof relative to a total surface area of the joint surface at 50% or more.

23. The ink jet printing head according to claim 19, wherein the partition wall comprises:
a first member made of piezoelectric ceramics;
a second member which is placed on the first member; and
an adhesive layer which is formed between the first member and the second member to adhere the first member and the second member,
a joint surface of the first member to be jointed to the second member being formed with a multitude of microprotrusions on a crystalline part thereof.

24. The ink jet printing head according to claim 19, wherein the partition wall is polarized in a direction perpendicular to a direction of applying a voltage thereto.

25. The ink jet printing head according to claim 19, wherein the partition wall is constructed by forming at least one cutaway having a certain length in a piezoelectric plate adhered to the base plate.

* * * * *